(12) United States Patent
Fukunaga et al.

(10) Patent No.: US 11,335,840 B2
(45) Date of Patent: May 17, 2022

(54) OPTICAL SEMICONDUCTOR DEVICE PACKAGE, OPTICAL SEMICONDUCTOR DEVICE, AND MANUFACTURING METHOD FOR OPTICAL SEMICONDUCTOR DEVICE PACKAGE

(71) Applicant: PANASONIC INTELLECTUAL PROPERTY MANAGEMENT CO., LTD., Osaka (JP)

(72) Inventors: Takahiro Fukunaga, Kyoto (JP); Akinobu Kittaka, Osaka (JP)

(73) Assignee: PANASONIC INTEILECTUAL PROPERTY MANAGEMENT CO., LTD., Osaka (JP)

( * ) Notice: Subject to any disclaimer, the term of this patent is extended or adjusted under 35 U.S.C. 154(b) by 124 days.

(21) Appl. No.: 16/853,307

(22) Filed: Apr. 20, 2020

(65) Prior Publication Data

US 2020/0251634 A1    Aug. 6, 2020

Related U.S. Application Data

(63) Continuation of application No. PCT/JP2018/030603, filed on Aug. 20, 2018.

(30) Foreign Application Priority Data

Oct. 25, 2017 (JP) .............................. JP2017-206258

(51) Int. Cl.
*H01L 33/60* (2010.01)
*H01L 33/00* (2010.01)

(52) U.S. Cl.
CPC ............ *H01L 33/60* (2013.01); *H01L 33/005* (2013.01); *H01L 2933/0058* (2013.01)

(58) Field of Classification Search
CPC ................... H01L 33/60; H01L 33/005; H01L 2933/0058; H01L 33/62
See application file for complete search history.

(56) References Cited

U.S. PATENT DOCUMENTS

2004/0046242 A1* 3/2004 Asakawa ............ H01L 31/0203
                                                     257/678
2009/0141498 A1* 6/2009 Kawanobe .............. H01L 33/60
                                                     362/267

(Continued)

FOREIGN PATENT DOCUMENTS

JP     2007-258514 A     10/2007
JP     2009-135355 A     6/2009

(Continued)

OTHER PUBLICATIONS www.EngineeringToolBox.com (Year: 2021).*

(Continued)

*Primary Examiner* — Feifei Yeung Lopez
(74) *Attorney, Agent, or Firm* — McDermott Will & Emery LLP

(57) ABSTRACT

An optical semiconductor device package includes a circuit board in which a first metal, a second metal, and a third metal are sequentially stacked in an optical semiconductor element mounting region. The first metal has a first standard electrode potential. The second metal is disposed on a portion of an upper surface of the first metal and has a second standard electrode potential that is greater than the first standard electrode potential. The third metal is disposed on the upper surface of the first metal and an upper surface of the second metal and has a third standard electrode potential that is greater than the first standard electrode potential and less than the second standard electrode potential.

9 Claims, 5 Drawing Sheets

(56) References Cited

U.S. PATENT DOCUMENTS

| | | | |
|---|---|---|---|
| 2012/0097545 A1 | 4/2012 | Imori et al. |
| 2012/0161180 A1 | 6/2012 | Komatsu et al. |
| 2015/0028372 A1 | 1/2015 | Nakanishi et al. |

FOREIGN PATENT DOCUMENTS

| | | | |
|---|---|---|---|
| JP | 2013-171969 A | 9/2013 |
| TW | 201202488 A | 1/2012 |
| TW | 201228040 A | 7/2012 |
| TW | 201517331 A | 5/2015 |

OTHER PUBLICATIONS

International Search Report and Written Opinion dated Nov. 13, 2018 in International Application No. PCT/JP2018/030603; with partial English translation.

Notice of Reasons for Refusal dated Jan. 4, 2022, issued the corresponding Japanese Patent Application No. 2019-549881; with English translation.

\* cited by examiner

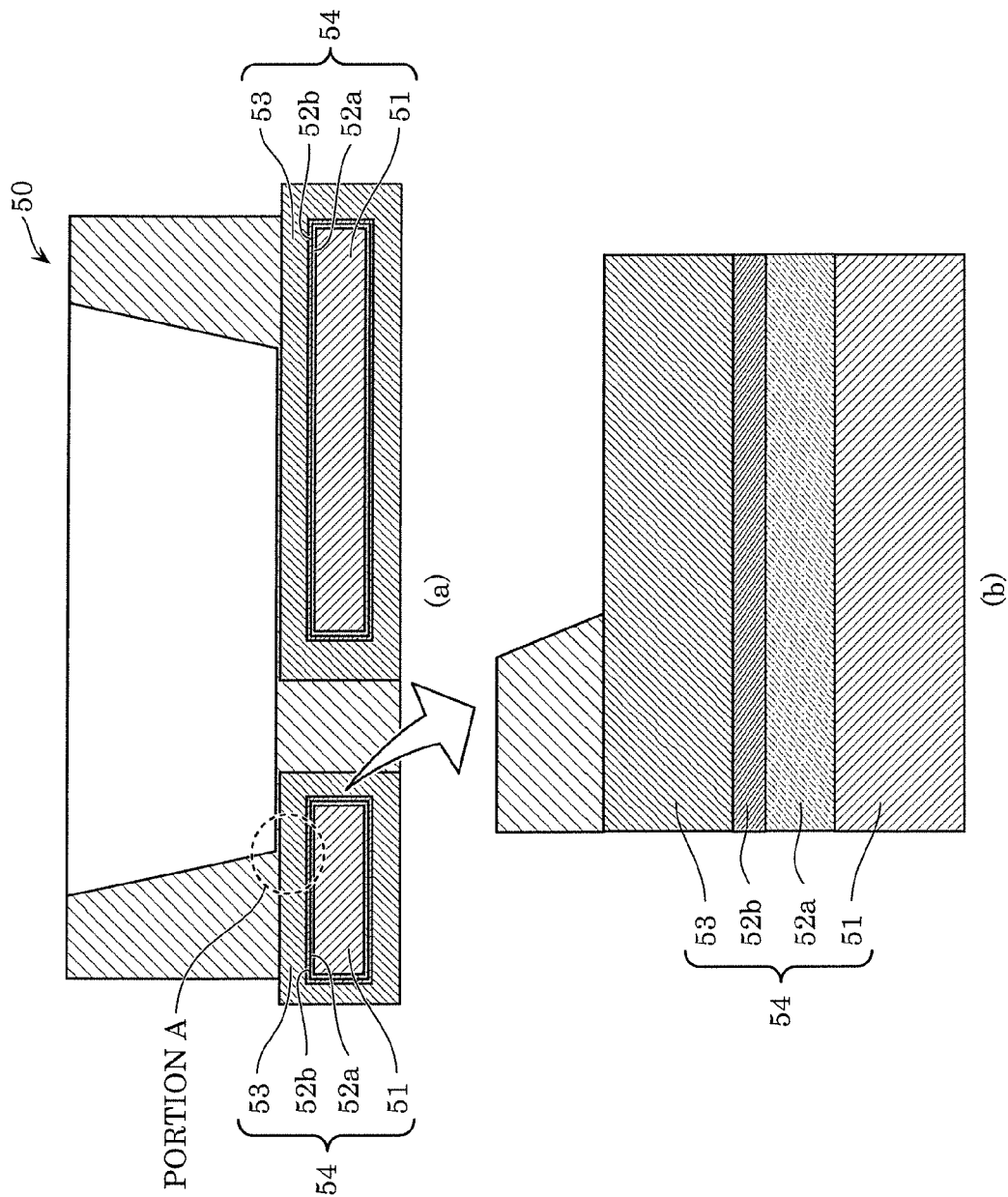

OPTICAL SEMICONDUCTOR DEVICE PACKAGE, OPTICAL SEMICONDUCTOR DEVICE, AND MANUFACTURING METHOD FOR OPTICAL SEMICONDUCTOR DEVICE PACKAGE

CROSS REFERENCE TO RELATED APPLICATIONS

This application is a U.S. continuation application of PCT International Patent Application Number PCT/JP2018/030603 filed on Aug. 20, 2018, claiming the benefit of priority of Japanese Patent Application Number 2017-206258 filed on Oct. 25, 2017, the entire contents of which are hereby incorporated by reference.

BACKGROUND

1. Technical Field

The present disclosure relates to optical semiconductor device packages, optical semiconductor devices, and manufacturing methods for the optical semiconductor device packages, and in particular to a technique which prevents deterioration of the optical semiconductor device packages when used for a long period of time.

2. Description of the Related Art

In conventional optical semiconductor device packages, a silver coating film is provided as a reflective coating film on the outermost layer (i.e., a bottom surface on which an optical semiconductor element is mounted) of a region which is enclosed by a resin enclosure (hereinafter also referred to as an "optical semiconductor element mounting region"). This region serves to improve luminous efficiency by effectively reflecting light to the outside of the optical semiconductor device package. It should be noted that, in this Specification, an optical semiconductor such as a light emitting element and light receiving element are referred to as an optical semiconductor element, a package for mounting the optical semiconductor element is, as an individual body, referred to as an optical semiconductor device package, and the entirety of the optical semiconductor device package on which the optical semiconductor element is mounted (i.e., a combination of the optical semiconductor element and the optical semiconductor device package) is referred to as an optical semiconductor device.

As a layer structure of the silver coating film of the optical semiconductor device package, silver plating is often provided on copper or a copper alloy (see, for example, Japanese Unexamined Patent Application Publication No. 2013-171969). However, with the silver plating having such a layer structure, there is a problem of a decrease in the degree of reflectance caused by discoloring of the surface of the silver plating into a color of copper, as a result of copper of underlayer metal being diffused to the surface of the silver plating due to the influence of heat generation caused by long-term use of the optical semiconductor device.

Meanwhile, as a method for preventing such a disadvantage, there is a method in which nickel plating is applied to provide a barrier layer above copper or a copper alloy for preventing copper diffusion, palladium plating is applied above the nickel plating for preventing diffusion of sulfur brightening agents in the nickel plating, and applying silver plating above the palladium plating (see, for example, Japanese Unexamined Patent Application Publication No. 2007-258514).

FIG. 5 is a cross-sectional view illustrating conventional optical semiconductor device package 50 in which nickel and palladium are used as a barrier layer for preventing copper diffusion. More specifically, (a) in FIG. 5 is a cross-sectional view illustrating the main body of conventional optical semiconductor device package 50. In FIG. 5, (b) is an enlarged view of portion A of (a) in FIG. 5.

As illustrated in (a) and (b) in FIG. 5, in optical semiconductor device package 50, circuit board 54 included in a lead frame includes, for example, a metal base material made of copper or copper alloy 51, an underlayer plating made of nickel plating 52a and palladium plating 52b, and a reflective layer made of silver or silver alloy 53. The underlayer plating and the reflective layer are stacked in stated order on substantially all over the metal base material. In an internal space of optical semiconductor device package 50, a predetermined optical semiconductor element is die-bonded and wire bonded, and then the internal space is filled with a sealing resin.

SUMMARY

In the case of the above-described layer structure, it is possible to prevent a decrease in the degree of reflectance caused by diffusion of copper of underlayer metal to the surface of the silver coating film due to a long-term thermal history of the optical semiconductor device.

However, when the optical semiconductor device is driven for a long period of time, light emitted from the optical semiconductor element irradiates titanium oxide which is a white pigment included in the resin enclosure that functions as a reflector (i.e., reflecting body), causing the titanium oxidize to be excited and exhibit a photocatalytic action. As a result, active oxygen (more specifically, superoxide anion) is generated which converts silver into silver oxide and causes blackening of silver, posing a new problem that a life-span of the optical semiconductor device is further shortened.

The present disclosure has been conceived in view of the above-described problems, and provides an optical semiconductor device package, etc. capable of effectively inhibiting (i) a decrease in the degree of reflectance of a reflective coating film resulting from discoloring of silver plating caused by diffusion of copper of underlayer metal due to heat generation of the optical semiconductor device, and (ii) shortening of a life-span of the optical semiconductor device resulting from blackening of silver due to active oxygen generated by a photocatalytic action of titanium oxide in the resin enclosure, which is induced by long-term driving.

In order to solve the above-described problems in the conventional techniques, an optical semiconductor device package according to one aspect of the present disclosure is an optical semiconductor device package for mounting an optical semiconductor element. The optical semiconductor device package includes: a circuit board; and a wall which is disposed on the circuit board, encloses an outer periphery of a region on the circuit board in which the optical semiconductor element is to be mounted, and includes a white pigment. In the optical semiconductor device package, the circuit board includes: a first metal having a first standard electrode potential; a second metal which is disposed on a portion of an upper surface of the first metal, and has a second standard electrode potential that is greater than the first standard electrode potential; and a third metal which is stacked on the upper surface of the first metal and an upper surface of the second metal, and has a third standard electrode potential that is greater than the first standard electrode potential and less than the second standard electrode potential.

In addition, in order to solve the above-described problems in the conventional techniques, an optical semiconductor device according to one aspect of the present disclosure includes: an optical semiconductor element; and the optical semiconductor device package on which the optical semiconductor element is mounted.

Furthermore, in order to solve the above-described problems in the conventional techniques, a manufacturing method for an optical semiconductor device package according to one aspect of the present disclosure is a manufacturing method for an optical semiconductor device package for mounting an optical semiconductor element. The manufacturing method includes: preparing a first metal having a first standard electrode potential; forming a second metal on a portion of an upper surface of the first metal, the second metal having a second standard electrode potential that is greater than the first standard electrode potential; and forming a third metal on the upper surface of the first metal and an upper surface of the second metal, the third metal having a third standard electrode potential that is greater than the first standard electrode potential and less than the second standard electrode potential.

With the optical semiconductor device package, etc. according to the present disclosure, it is possible to effectively inhibit (i) a decrease in the degree of reflectance of a reflective coating film resulting from discoloring of silver plating caused by diffusion of copper of underlayer metal due to heat generation of the optical semiconductor device, and (ii) shortening of a life-span of the optical semiconductor device resulting from blackening of silver due to active oxygen generated by a photocatalytic action of titanium oxide in the resin enclosure, which is induced by long-term driving.

Accordingly, even when the optical semiconductor device is driven for a long period of time, an advantageous effect that sufficient emission luminance can be obtained as the optical semiconductor device without impairing the innate feature of silver having a high degree of reflectance.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 5 is a cross-sectional view illustrating a configuration of a conventional optical semiconductor device package.

DETAILED DESCRIPTION OF THE EMBODIMENT

Hereinafter, an embodiment of the present disclosure will be described with reference to the attached drawings. It should be noted that the present disclosure is not limited to the embodiment and can be implemented with modifications as appropriate within the technical scope of the present discloser. In other words, the embodiment described below indicates one specific example of the present disclosure. The numerical values, shapes, materials, structural components, the arrangement and connection of the structural components, steps, the processing order of the steps, and so on, shown in the following embodiment are mere examples, and therefore do not limit the present disclosure. In addition, among the structural components in the following embodiment, structural components not recited in any one of the independent claims which represent the most generic concept of the present disclosure are described as arbitrary structural components. In addition, each diagram is not necessarily strictly illustrated. In each of the diagrams, substantially the same structural components are assigned with the same reference signs, and redundant descriptions will be omitted or simplified.

(Configuration of Optical Semiconductor Device Package)

Figure 1:
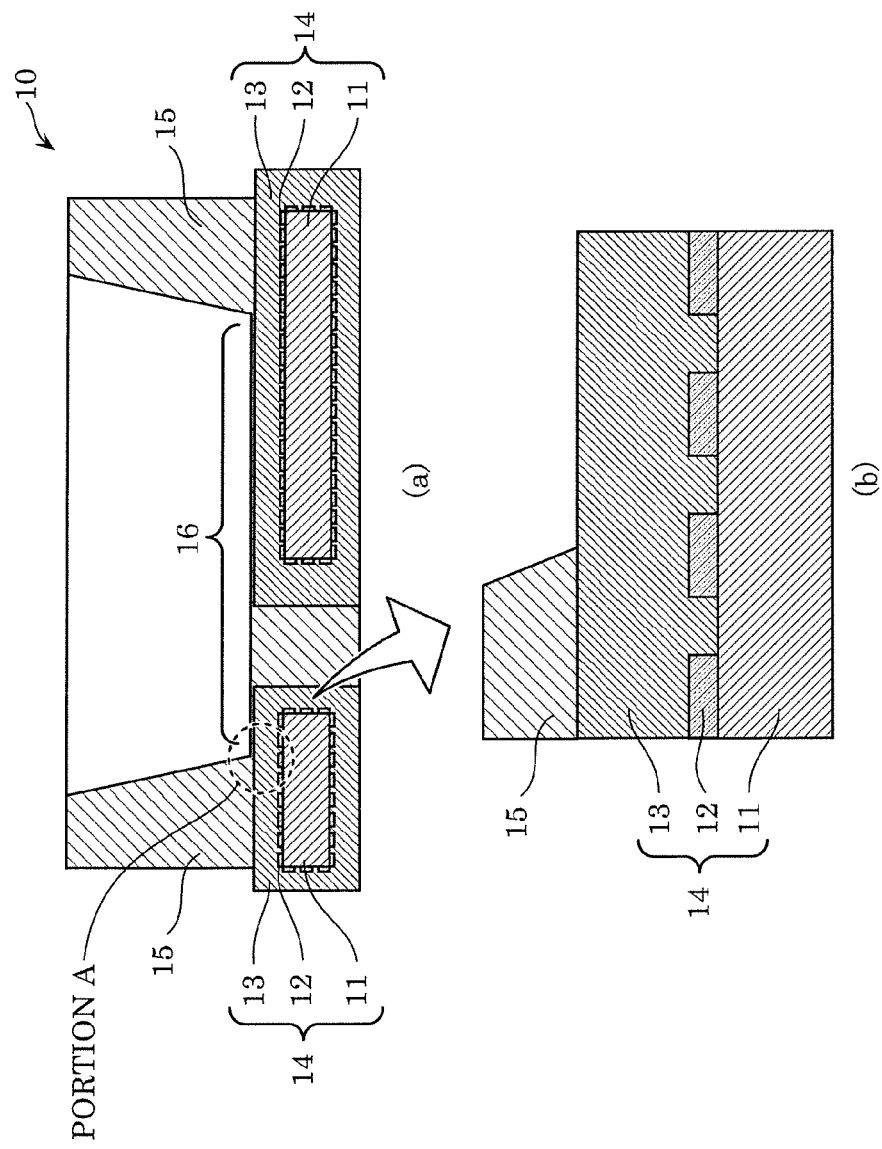
FIG. 1 is a cross-sectional view illustrating a configuration of an optical semiconductor device package according to an embodiment of the present disclosure.

FIG. 1 is a cross-sectional view of optical semiconductor device package 10 according to the embodiment of the present disclosure. More specifically, (a) in FIG. 1 is a cross-sectional view illustrating a main body of optical semiconductor device package 10 according to the embodiment. In FIG. 1, (b) is an enlarged view of portion A of (a) in FIG. 1. It should be noted that optical semiconductor device package 10 according to the embodiment is a package which is suitable for mounting an optical semiconductor element, and an element to be mounted is not limited to the optical semiconductor element and may be a general semiconductor element. More specifically, optical semiconductor device package 10 according to the embodiment is a package that can be also referred to as a "semiconductor device package". In addition, optical semiconductor device package 10 has a rectangular parallelepiped shape as a whole.

In (a) in FIG. 1, optical semiconductor device package 10 according to the embodiment is formed by fabricating a metal base material including copper, iron, nickel, or an alloy including at least two of copper, iron, and nickel into a desired shape through a molding technique such as pressing, etching, or the like, and applying a predetermined surface processing and resin molding of a resin enclosure including a white pigment. More specifically, optical semiconductor device package 10 according to the embodiment is an optical semiconductor device package for mounting an optical semiconductor element, and includes circuit board 14 included in a lead frame, and resin enclosure 15 that is a wall containing a white pigment and enclosing an outer periphery of a region on circuit board 14 (i.e., optical semiconductor element mounting region 16) on which the optical semiconductor element is mounted. Circuit board 14 includes: first metal 11 having a first standard electrode potential; second metal 12 which is disposed on a portion of an upper surface of first metal 11, and has a second standard electrode potential that is greater than the first standard electrode potential; and third metal 13 which is stacked on the upper surface of first metal 11 and an upper surface of second metal 12, and has a third standard electrode potential that is greater than the first standard electrode potential and less than the second standard electrode potential.

It should be noted that, FIG. 1 shows a configuration example in which second metal 12 is disposed on a portion of the whole surface of first metal 11 including not only the upper surface but also a lower surface and side surfaces of first metal 11, and third metal 13 is disposed to cover all of the exposed surfaces of first metal 11 and second metal 12. In addition, circuit board 14 is composed of a pair of circuit boards mutually spaced apart (laterally spaced apart in FIG. 1). The pair of circuit boards 14 are disposed on the same plane and have the same configuration.

In the configuration according to the embodiment, in optical semiconductor element mounting region 16 for mounting a semiconductor element or an optical semiconductor element (not illustrated), a plated layer made of silver or a silver alloy which are examples of third metal 13 is disposed on an outermost surface of circuit board 14 for improving the degree of light reflectance.

More specifically, as illustrated in (b) in FIG. 1, in optical semiconductor element mounting region 16, circuit board 14 included in a lead frame includes, on the upper surface of copper or a copper alloy which are examples of first metal 11 as a metal base material, palladium or a palladium alloy which are examples of second metal 12 as a barrier layer for preventing copper diffusion and silver or a silver alloy which are examples of third metal 13 as a reflection layer is stacked on the upper surfaces of first metal 11 and second metal 12. Resin enclosure 15 which has a bowl shape and forms a reflector (i.e., reflecting body) that reflects, to the outside (the upper side in FIG. 1), light emitted by a semiconductor element to be mounted is formed as a wall on a portion of the surface of third metal 13. As described above, second metal 12 is disposed between first metal 11 and third metal 13 in the in a stacking direction. In addition, first metal 11 is also disposed below resin enclosure 15 that is a wall.

The following describes in detail each of the structural components of optical semiconductor device package 10 according to the embodiment.

[First Metal]

First metal 11 forms a metal base material of a lead frame and has a first standard electrode potential. First metal 11 is, for example, a base material made of copper or a copper alloy. It should be noted that copper strike plating or copper plating may be applied to the upper surface of the base material made of copper or a copper alloy which are examples of first metal 11. In addition, as first metal 11, in addition to copper or a copper alloy base material, iron or an iron-nickel alloy, a stainless material, or an aluminum material may be used as a metal base material, by applying copper strike plating or copper plating to the upper surface.

[Second Metal]

Second metal 12 forms the barrier layer for preventing copper diffusion, is disposed on a portion of the upper surface of first metal 11, and has a second standard electrode potential greater than the first standard electrode potential. Second metal 12 is, for example, a plated layer made of palladium or a palladium alloy. Since palladium metal has a high affinity for silver and copper, the plated layer made of palladium or a palladium alloy which are examples of second metal 12 functions as a layer for improving adhesion between the silver layer including one of the examples of third metal 13 and the copper layer including one of the examples of first metal 11. In addition, the palladium layer serves as a filter which prevents excessive diffusion of copper to the silver layer, and effectively inhibits a decrease in the degree of reflectance due to excessive diffusion of copper that is one of the examples of first metal 11 to the outermost surface of silver (i.e., reflective coating film) that is one of the examples of third metal 13.

In addition, since silver that is one of the examples of third metal 13 is in direct contact with copper that is one of the examples of first metal 11, the problem of shortening of a life-span of the optical semiconductor device due to blackening of silver caused by active oxygen (more specifically, superoxide anion) generated from oxygen in the air due to the influence of a photocatalytic action caused by "heat" and "light" resulting from long-term driving of the optical semiconductor device and "titanium oxide which is a white pigment included in resin enclosure 15 that functions as a reflector" is also suppressed by the effect of sacrificial corrosion as a result of active oxygen transmitted through third metal 13 reacting with first metal 11 (copper or a copper alloy in the embodiment) and corroding due to first metal 11 (copper or a copper alloy in the embodiment) that has a standard electrode potential less than a standard electrode potential of third metal 13 (silver or a silver alloy in the embodiment) being in contact with third metal 13 (silver or a silver alloy in the embodiment).

The thickness of the plated later made of palladium or a palladium alloy which are examples of second metal 12 is preferably 0.001 µm to 0.06 µm, and more preferably 0.003 µm to 0.02 µm.

In addition, an area of the boundary surface between first metal 11 and third metal 13 is formed to be less than an area of the boundary surface between first metal 11 and second metal 12.

With this configuration, even when the optical semiconductor device is driven for a long period of time, since second metal 12 is present as an underlayer metal of third metal 13 (silver or a silver alloy in the embodiment) of optical semiconductor element mounting region 16, it is possible to prevent a decrease in the degree of reflectance that is caused by a great amount of diffusion of copper that is one of the examples of first metal 11 to the surface of third metal 13 (i.e., reflective coating film).

Copper that is one of the examples of first metal 11 is less likely to diffuse to the surface of third metal 13, as the area of the boundary surface between first metal 11 and second metal 12 increases. However, when second metal 12 completely covers first metal 11, first metal 11 is not in direct contact with third metal 13, and thus the effect of sacrificial corrosion cannot be exerted by first metal 11. In view of the above, in the embodiment, second metal 12 does not completely cover first metal 11, and covers only a portion of first metal 11. More specifically, second metal 12 is disposed on a portion of the upper surface of first metal 11.

[Third Metal]

Third metal 13 forms a reflective layer, is stacked on the upper surface of first metal 11 and the upper surface of second metal 12, and has a third standard electrode potential that is greater than the first standard electrode potential and less than the second standard electrode potential. Third metal 13 is, for example, a plated layer made of silver or a silver alloy. The plated layer made of silver or a silver alloy which are examples of third metal 13 may have not only the function as a light reflective portion (i.e., reflective coating film), but also a function as a line on which die bonding, wire bonding, flip-chip bonding, or soldering can be carried out. The thickness of silver is preferably 0.1 µm to 6 µm, and more preferably 0.5 µm to 3 µm. When a film is excessively thin, light is transmitted through the film and absorbed by an underlayer plating, and thus the degree of reflectance decreases. On the other hand, when a film is excessively thick, the amount of use of Ag that is a noble metal increases, leading to rise in the manufacturing costs.

[Resin Enclosure]

Resin enclosure 15 is a bowl-shaped wall that contains a white pigment. Resin enclosure 15 forms a reflector that reflects, to the outside (the upper side in FIG. 1), light emitted from an optical semiconductor element to be mounted, encloses the optical semiconductor element in a quadrilateral shape in a top view. It should be noted that any resin may be employed as resin enclosure 15 as long as resin enclosure 15 contains titanium oxide ($TiO_2$) as the white pigment. A base resin is made of a thermoplastic resin such as polyphthalamide (PPA), liquid crystal polymer (LCP), polycyclohexylenedimethylene terephthalate (PCT), unsaturated polyester (UP), polypropylene (PP), etc., or a thermosetting resin such as an epoxy resin, a silicone resin, a polyimide resin, an acrylic resin, etc.

(Feature of Optical Semiconductor Device Package)

Figure 2:
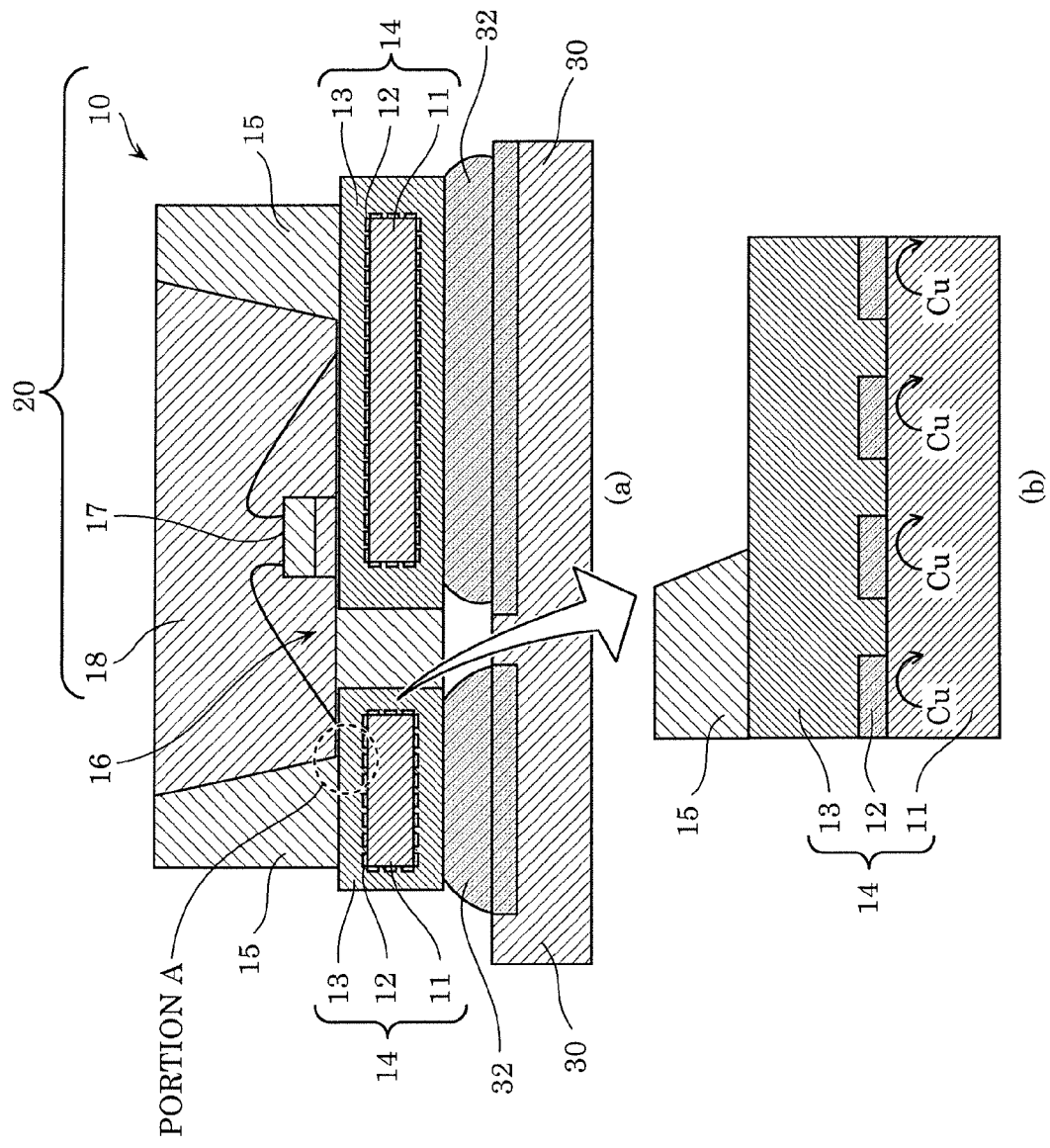
FIG. 2 is a cross-sectional view for explaining a first feature of the optical semiconductor device package according to the embodiment of the present disclosure.
Figure 3:
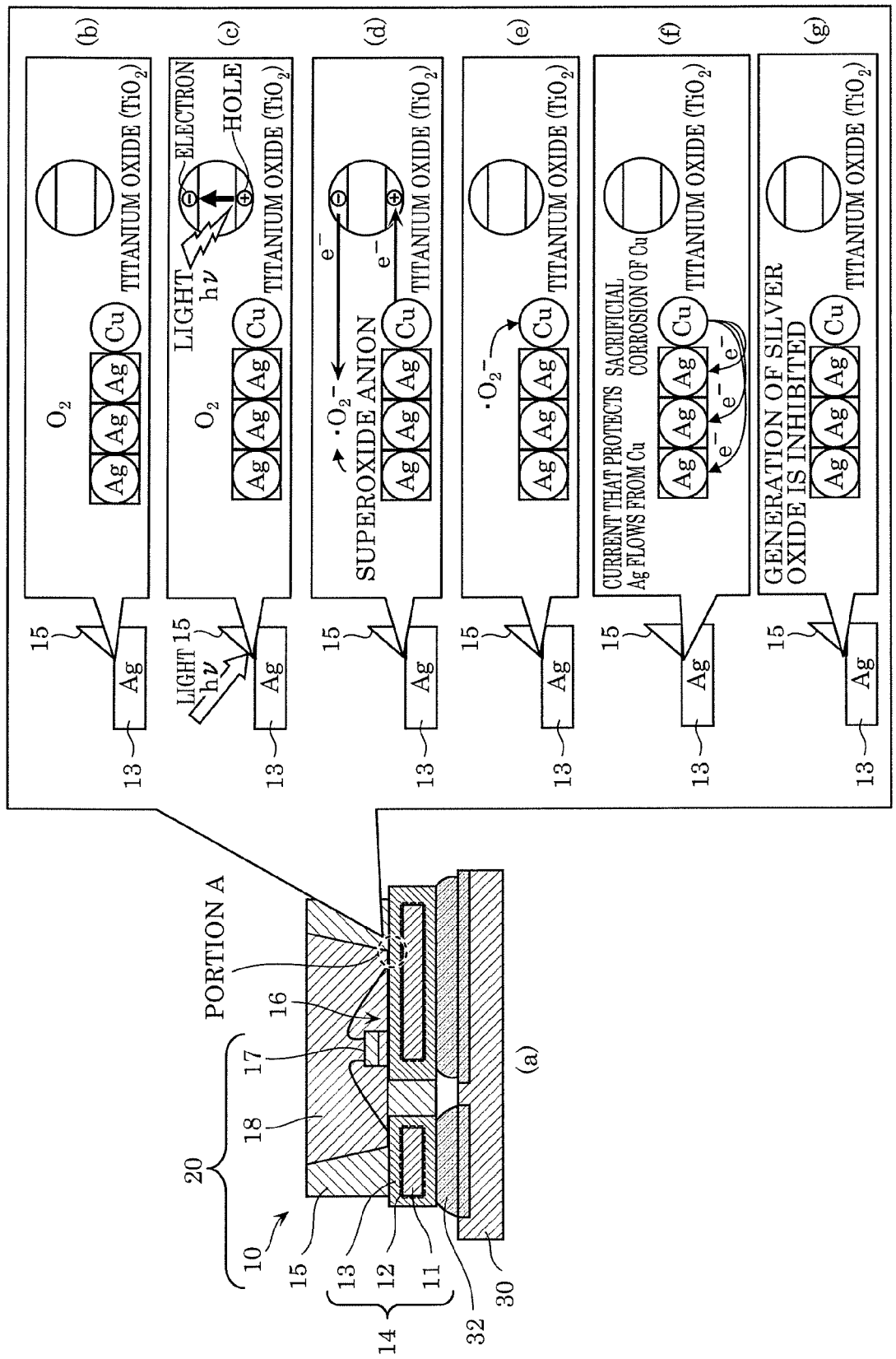
FIG. 3 is a cross-sectional view for explaining a second feature of the optical semiconductor device package according to the embodiment of the present disclosure.

The following describes in more detail, with reference to FIG. 2 and FIG. 3, a feature of optical semiconductor device package 10 according to the embodiment which has the above-described configuration.

FIG. 2 is a cross-sectional view for explaining the first feature; that is, inhibiting a decrease in the degree of reflectance of a reflective coating film, of optical semiconductor device package 10 according to the embodiment of the present disclosure. It should be noted that FIG. 2 illustrates, as a usage state of optical semiconductor device package 10, optical semiconductor device 20 in which optical semiconductor device package 10 and optical semiconductor element 17 mounted on optical semiconductor device package 10 are combined. In FIG. 2, (a) is a cross-sectional view of optical semiconductor device 20 that is jointed to mounting board 30 using solder 32. In FIG. 2, (b) is an enlarged view of portion A of (a) in FIG. 2.

As illustrated in (a) in FIG. 2, optical semiconductor device 20 is formed by die bonding and wire bonding optical semiconductor element 17 such as an LED chip onto optical semiconductor element mounting region 16 of optical semiconductor device package 10, and then filling the internal space of optical semiconductor device package 10 with sealing resin 18.

As illustrated in (b) in FIG. 2, optical semiconductor device package 10 according to the embodiment has a configuration in which first metal 11, second metal 12, and third metal 13 are in contact with one another in optical semiconductor element mounting region 16. An area of the boundary surface between first metal 11 and third metal 13 is arranged to be smaller than an area of the boundary surface between first metal 11 and second metal 12. As shown in (b) in FIG. 2, the third metal layer 13 is in direct contact with the upper surface of the first metal layer 11 and the upper surface of the second metal layer 12.

With this configuration, even when optical semiconductor device 20 is driven for a long period of time, since second metal 12 is present as an underlayer of third metal 13 (silver or a silver alloy in the embodiment) that forms a reflective coating film of optical semiconductor element mounting region 16, it is possible to prevent a great amount of copper that is included in first metal 11 from being diffused to third metal 13, and thus a decrease in the degree of reflectance of third metal 13 can be inhibited.

FIG. 3 is a cross-sectional view for explaining the second feature of optical semiconductor device package 10 according to the embodiment of the present disclosure; that is, inhibiting shortening of a life-span of the optical semiconductor device. It should be noted that FIG. 3 also illustrates, as a usage state of optical semiconductor device package 10, optical semiconductor device 20 in which optical semiconductor device package 10 and optical semiconductor element 17 mounted on optical semiconductor device package 10 are combined. In FIG. 3, (a) is a cross-sectional view of optical semiconductor device 20 that is jointed to mounting board 30 using solder 32. In FIG. 3, (b) to (g) illustrate a mechanism for inhibiting generation of a silver oxide in portion A of (a) in FIG. 3.

In circuit board 14 of optical semiconductor device package 10 according to the embodiment, the relationship between standard electrode potentials of first metal 11, second metal 12, and third metal 13 ("a first standard electrode potential", "a second standard electrode potential", and "a third standard electrode potential", respectively) is represented by the first standard electrode potential<the third standard electrode potential<the second standard electrode potential. With optical semiconductor device package 10 according to the embodiment, the problem of shortening of a life-span of optical semiconductor device 20 due to blackening of silver caused by active oxygen (more specifically, superoxide anion) generated from oxygen in the air due to the influence of a photocatalytic action caused by "heat" and "light" resulting from long-term driving of optical semiconductor device 20 and "titanium oxide which is a white pigment included in resin enclosure 15 that functions as a reflector" is also suppressed by the effect of sacrificial corrosion as a result of active oxygen transmitted through third metal 13 reacting with first metal 11 (copper or a copper alloy in the embodiment) and corroding due to first metal 11 (copper or a copper alloy in the embodiment) that has a standard electrode potential less than a standard electrode potential of third metal 13 (silver or a silver alloy in the embodiment) being in contact with third metal 13 (silver or a silver alloy in the embodiment) ((b) to (g) in FIG. 3). In other words, the sacrificial corrosion of Cu ((b) to (e) in FIG. 3) causes a current that protects Ag to flow from Cu ((f) in FIG. 3), thereby inhibiting Ag from being oxidized into silver oxide ($Ag_2O$) ((g) in FIG. 3).

Accordingly, even when optical semiconductor device 20 is driven for a long period of time, an advantageous effect that sufficient emission luminance can be obtained as optical semiconductor device 20 without impairing the innate feature of silver having a high degree of reflectance.

(Manufacturing Method for Optical Semiconductor Device Package)

The following describes in detail optical semiconductor device package 10 according to the embodiment, together with an overall manufacturing process thereof.

Figure 4:
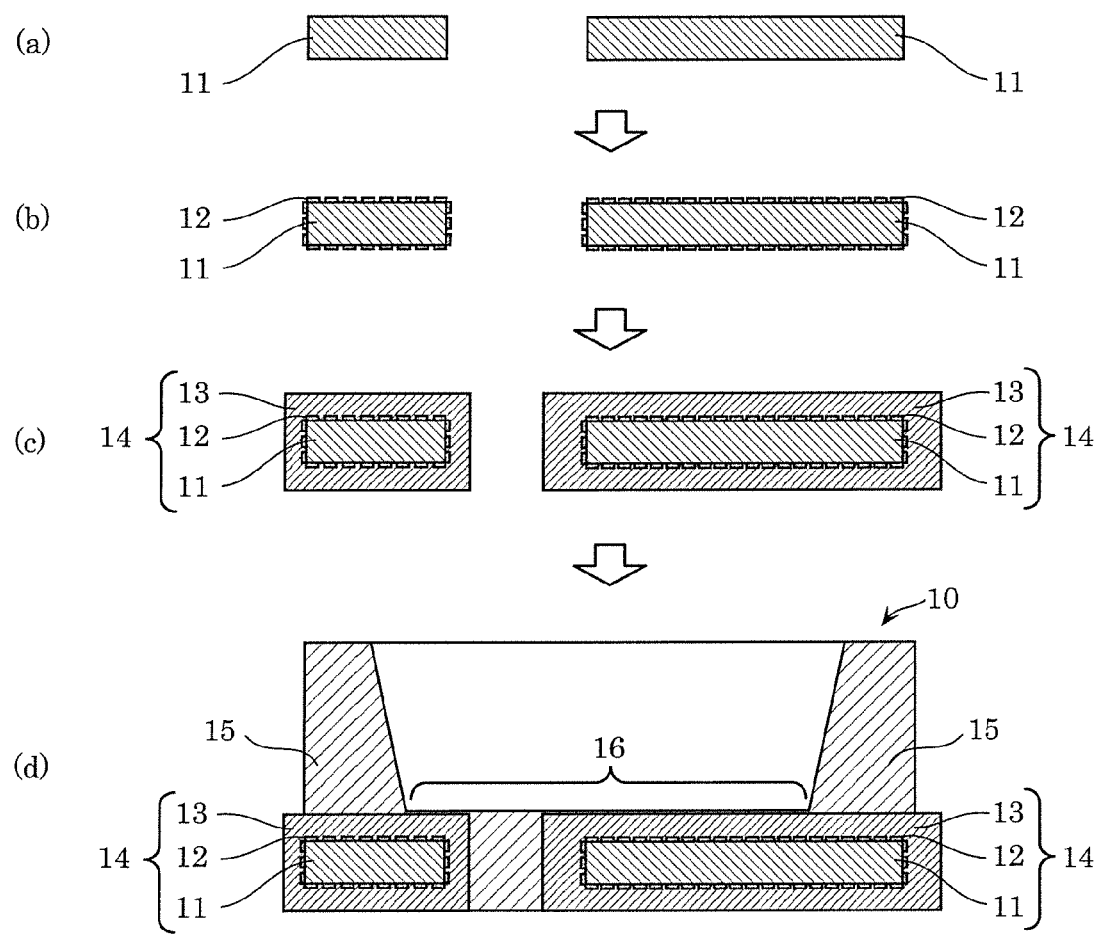
FIG. 4 is a diagram illustrating a manufacturing process of the optical semiconductor device package according to the embodiment of the present disclosure.

FIG. 4 is a diagram indicating a manufacturing process of optical semiconductor device package 10 according to the embodiment of the present disclosure.

First, a base material made of copper or a copper alloy which are examples of first metal 11 is prepared (a preparation process of the first metal; (a) in FIG. 4). Next, a plated layer made of palladium or a palladium alloy is formed as second metal 12 on a portion of a surface of first metal 11 (a forming process of the second metal; (b) in FIG. 4). Next, a plated layer made of silver or a silver alloy which are examples of third metal 13 is formed on first metal 11 and second metal 12 (a forming process of the third metal; (c) in FIG. 4). Next, resin enclosure 15 which includes a white pigment is formed on a portion of a surface of third metal 13 (a forming process of a resin enclosure; (d) in FIG. 4). The following describes in detail the forming process of the second metal, the forming process of the third metal, and the forming process of the resin enclosure.

(Forming Process of Second Metal)

Palladium plating or palladium alloy plating is applied, as second metal 12, to a portion of the surface of the base material made of copper or a copper alloy which are examples of first metal 11, which has been prepared in the preparation process of the first metal ((b) in FIG. 4). The thickness of palladium is preferably 0.001 µm to 0.06 µm, and more preferably 0.003 µm to 0.02 µm. Copper that is one of the examples of first metal 11 is less likely to diffuse to the surface of third metal 13, as the area of the boundary surface between first metal 11 and second metal 12 increases. However, when second metal 12 completely covers first metal 11, first metal 11 is not in direct contact with third metal 13, and thus the effect of sacrificial corrosion cannot be exerted by first metal 11. For that reason, the area of the boundary surface between first metal 11 and third metal 13 may be greater than zero and less than the area of the boundary surface between first metal 11 and second metal 12.

(Forming Process of Third Metal)

Silver plating or silver alloy plating is applied, as third metal 13, to the surface of first metal 11 and second metal 12 ((c) in FIG. 4). The thickness of third metal 13 is preferably 0.1 µm to 6 µm, and more preferably 0.5 µm to 3 µm. With third metal 13 being provided, an advantageous effect of improving the performance of die bonding, wire bonding, flip-chip bonding, or soldering is yielded, in addition to the advantageous effect of improving the degree of reflectance.

(Forming Process of Resin Enclosure)

Next, resin enclosure 15 is formed on a portion of the surface of third metal 13 to enclose the outer periphery of optical semiconductor element mounting region 16 ((d) in FIG. 4). With resin enclosure 15 being provided, a function of insulating optical semiconductor element mounting region 16 from a wire bonding area and a function as a reflector for light emitted from a light emitting element are exerted. It should be noted that resin enclosure 15 includes a white pigment containing titanium oxide having a high degree of light reflectance, and it is possible to employ, as a base resin, a thermoplastic resin such as polyphthalamide (PPA), liquid crystal polymer (LCP), polycyclohexylenedimethylene terephthalate (PCT), unsaturated polyester (UP), polypropylene (PP), etc., or a thermo-setting resin such as an epoxy resin, a silicone resin, a polyimide resin, an acrylic resin, etc.

Through the above-described processes, optical semiconductor device package 10 is manufactured.

It should be noted that optical semiconductor device 20 can be manufactured by die bonding optical semiconductor element 17 onto optical semiconductor element mounting region 16 of optical semiconductor device package 10, wire bonding optical semiconductor element 17 and circuit board 14, and then filling the internal space of optical semiconductor device package 10 with sealing resin 18.

Optical semiconductor device package 10, optical semiconductor device 20, and the manufacturing method for optical semiconductor device package 10 have been described hereinbefore based on the embodiment. However, the present disclosure is not limited to the embodiment. Other forms in which various modifications apparent to those skilled in the art are applied to the embodiment, or forms structured by combining some of structural components in the embodiment may be included within the scope of the present disclosure, unless such changes and modifications depart from the scope of the present disclosure.

For example, although optical semiconductor device package 10 according to the foregoing embodiment is composed of a pair of circuit boards 14 which are mutually spaced apart, the present disclosure is not limited to this configuration, and optical semiconductor device package 10 may be composed of one circuit board 14, or three or more circuit boards 14.

In addition, an LED chip is mounted as optical semiconductor element 17 on optical semiconductor device package 10 according to the above-described embodiment. However, the present disclosure is not limited to this. Optical semiconductor element 17 is not limited to a light emitting element, and may be a light receiving element or a mixture of a light emitting element and a light receiving element.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure is applicable to an optical semiconductor device package and an optical semiconductor device, and in particular to an optical semiconductor device package capable of inhibiting a decrease in luminous efficiency caused by long-term driving of the optical semiconductor device.

What is claimed is:

1. An optical semiconductor device package for mounting an optical semiconductor element, the optical semiconductor device package comprising:
   a circuit board; and
   a wall which is disposed on the circuit board, encloses an outer periphery of a region on the circuit board in which the optical semiconductor element is to be mounted, and includes a white pigment, wherein
   the circuit board includes:
      a first metal having a first standard electrode potential;
      a second metal which is disposed on a portion of an upper surface of the first metal, and has a second standard electrode potential that is greater than the first standard electrode potential; and
      a third metal which is stacked on the upper surface of the first metal and an upper surface of the second metal, and has a third standard electrode potential that is greater than the first standard electrode potential and less than the second standard electrode potential, and
   the second metal is disposed exclusively on the portion of the upper surface of the first metal, and
   the third metal is stacked to be in direct contact with the upper surface of the first metal and the upper surface of the second metal.

2. The optical semiconductor device package according to claim 1, wherein the white pigment includes titanium oxide.

3. The optical semiconductor device package according to claim 1, wherein the second metal is disposed between the first metal and the third metal in a stacking direction.

4. The optical semiconductor device package according to claim 1, wherein the first metal includes copper or a copper alloy.

5. The optical semiconductor device package according to claim 1, wherein the second metal includes palladium or a palladium alloy.

6. The optical semiconductor device package according to claim 1, wherein an area of a boundary surface between the first metal and the third metal is smaller than an area of a boundary surface between the first metal and the second metal.

7. The optical semiconductor device package according to claim 1, wherein the first metal is disposed below the wall.

8. An optical semiconductor device, comprising:
an optical semiconductor element; and
the optical semiconductor device package according to claim 1 on which the optical semiconductor element is mounted.

9. A manufacturing method for an optical semiconductor device package for mounting an optical semiconductor element, the manufacturing method comprising:
preparing a first metal having a first standard electrode potential;
forming a second metal on a portion of an upper surface of the first metal, the second metal having a second standard electrode potential that is greater than the first standard electrode potential; and
forming a third metal on the upper surface of the first metal and an upper surface of the second metal, the third metal having a third standard electrode potential that is greater than the first standard electrode potential and less than the second standard electrode potential,
wherein in the forming of the second metal, the second metal is formed exclusively on the portion of the upper surface of the first metal, and
in the forming of the third metal, the third metal is formed to be in direct contact with the upper surface of the first metal and the upper surface of the second metal.

* * * * *